(12) United States Patent
Ernst et al.

(10) Patent No.: US 6,528,877 B2
(45) Date of Patent: Mar. 4, 2003

(54) SEMICONDUCTOR COMPONENT HAVING A CHIP CARRIER WITH OPENINGS FOR MAKING CONTACT

(75) Inventors: Georg Ernst, Thalmassing (DE); Thomas Zeiler, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/925,171

(22) Filed: Aug. 8, 2001

(65) Prior Publication Data

US 2002/0041014 A1 Apr. 11, 2002

Related U.S. Application Data

(63) Continuation of application No. PCT/DE00/00328, filed on Feb. 3, 2000.

(30) Foreign Application Priority Data

Feb. 8, 1999 (DE) ......................................... 199 05 055

(51) Int. Cl.[7] .............................................. H01L 23/48
(52) U.S. Cl. ...................... 257/707; 257/692; 257/784
(58) Field of Search ................................ 257/706, 707, 257/712, 737, 738, 734, 784, 690, 692, 696

(56) References Cited

U.S. PATENT DOCUMENTS

| | | | |
|---|---|---|---|
| 3,825,803 A | 7/1974 | Budde | |
| 4,700,276 A | 10/1987 | Freyman et al. | |
| 5,436,492 A | 7/1995 | Yamanaka | |
| 5,512,781 A | 4/1996 | Inoue | |
| 5,629,835 A | 5/1997 | Mahulikar et al. | |
| 5,661,088 A | 8/1997 | Tessier et al. | |
| 6,097,089 A | * 8/2000 | Gaku et al. | 257/712 |
| 6,121,686 A | * 9/2000 | Togawa | 257/778 |
| 6,124,637 A | * 9/2000 | Freyman et al. | 257/736 |
| 6,130,480 A | * 10/2000 | Ohuchi et al. | 257/738 |
| 6,229,209 B1 | * 5/2001 | Nakamura et al. | 257/737 |
| 6,232,650 B1 | * 5/2001 | Fujisawa et al. | 257/666 |
| 6,291,892 B1 | * 9/2001 | Yamaguchi | 257/778 |
| 6,291,895 B1 | * 9/2001 | Taniguchi et al. | 257/782 |
| 6,297,553 B1 | * 10/2001 | Horiuchi et al. | 257/737 |
| 6,172,419 B1 | * 1/2002 | Kinsman | 257/737 |
| 6,191,477 B1 | * 2/2002 | Hashemi | 257/706 |
| 6,208,525 B1 | * 3/2002 | Imasu et al. | 361/783 |
| 6,356,453 B1 | * 3/2002 | Juskey et al. | 361/760 |

FOREIGN PATENT DOCUMENTS

| | | |
|---|---|---|
| DE | 235 152 A1 | 4/1986 |
| EP | 0 896 368 A1 | 2/1999 |
| JP | 10247715 A | 9/1998 |

* cited by examiner

*Primary Examiner*—Jerome Jackson
*Assistant Examiner*—Lourdes Cruz
(74) *Attorney, Agent, or Firm*—Laurence A. Greenberg; Werner H. Stemer; Gregory L. Mayback

(57) ABSTRACT

A semiconductor component includes a chip carrier having a first surface, a second surface, and openings therein. At least one semiconductor chip is mounted on the chip carrier. Soldering connection points are formed by at least one metal foil that lines the openings and that extends through the openings. Contact-making points are connected to the semiconductor chip and form electrically conductive connections which extend through the openings in the chip carrier to the soldering connection points. A further metal foil is located between the semiconductor chip and the chip carrier and forms a soldering connection point. The openings include at least one opening that is located underneath the semiconductor chip. The further metal foil extends through the opening that is located underneath the semiconductor chip to the first surface and to the second surface.

11 Claims, 8 Drawing Sheets

Leadframe

Laminate

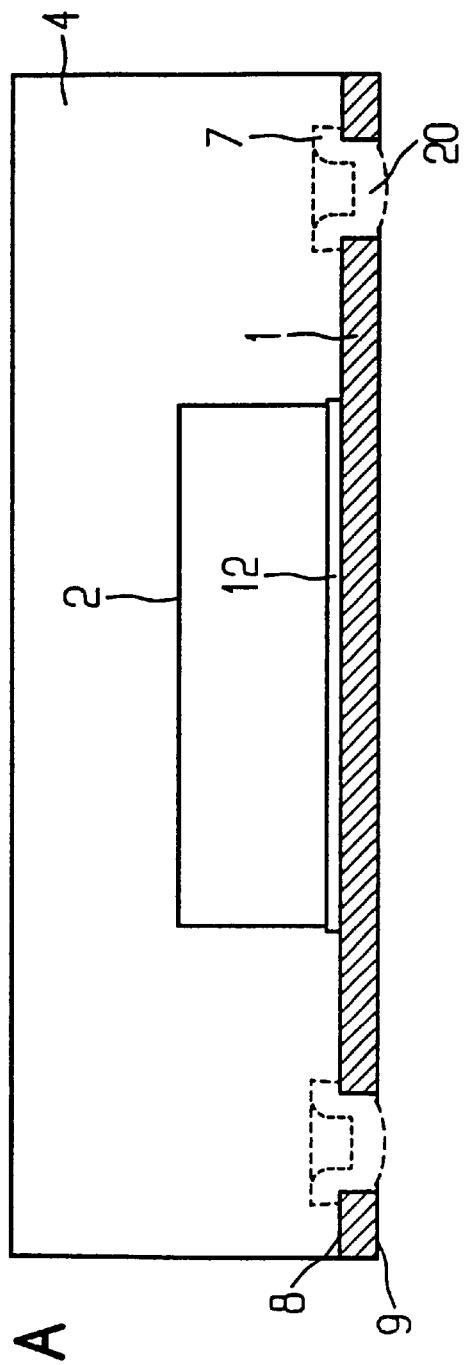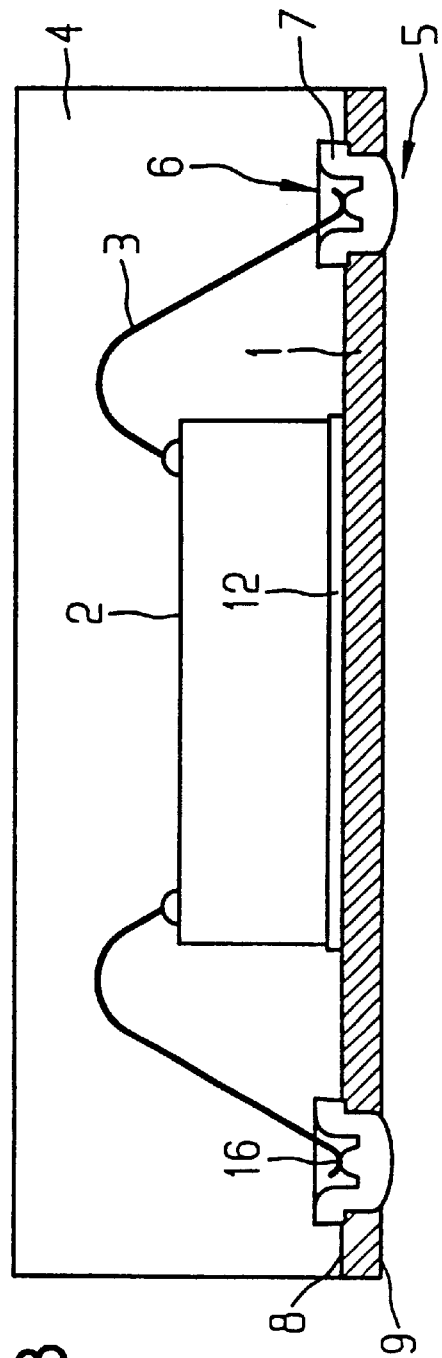

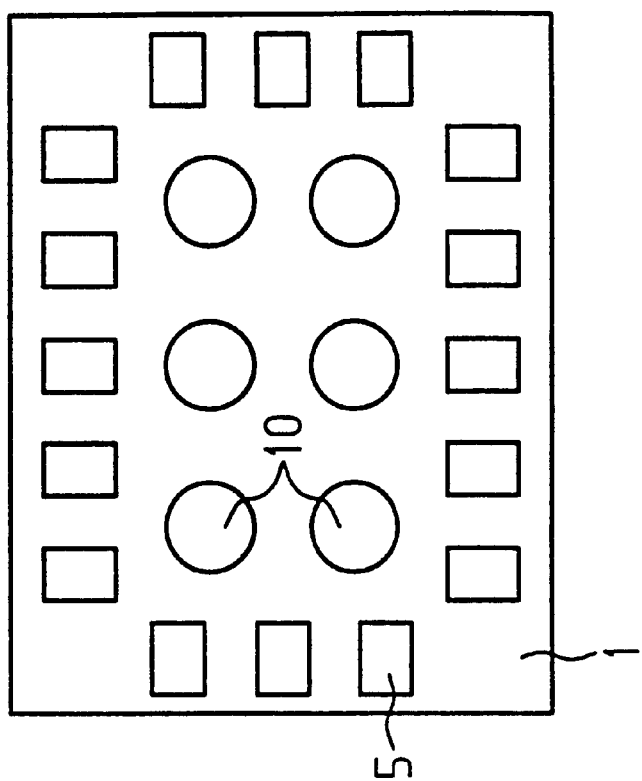
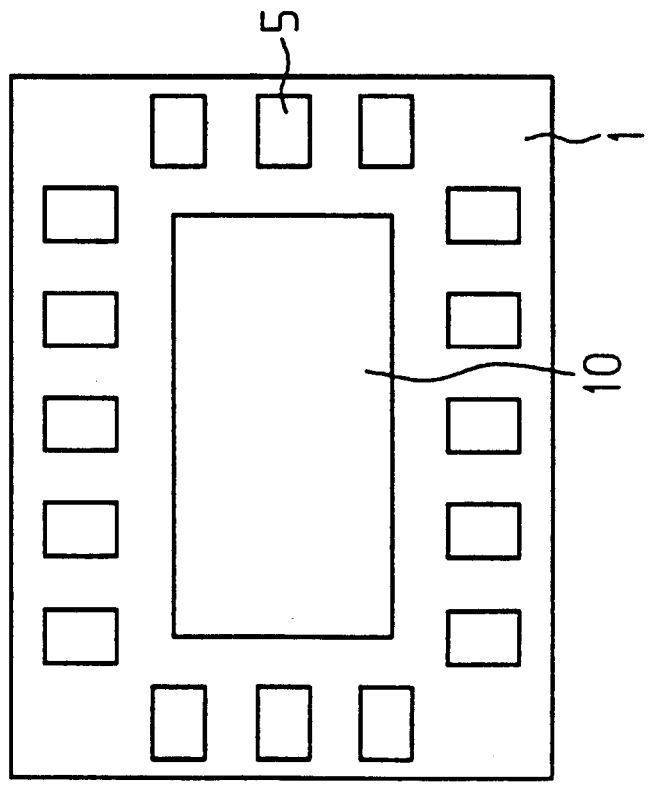

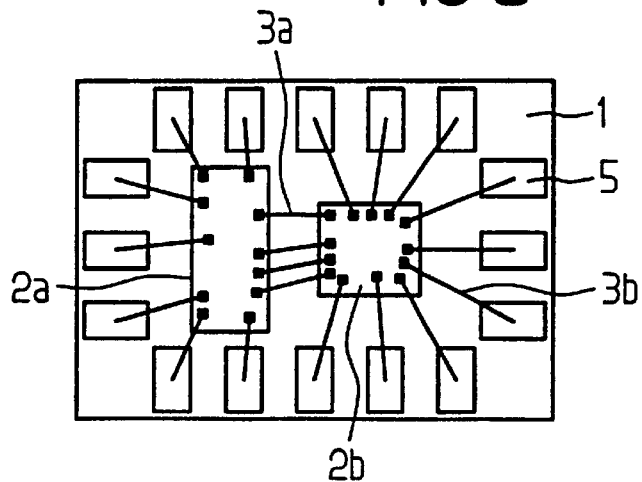
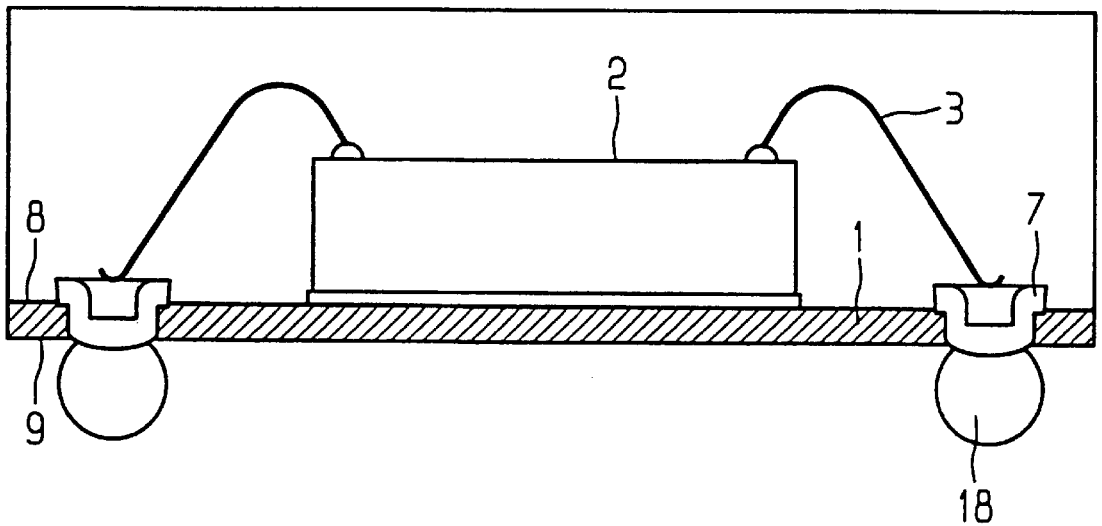

SEMICONDUCTOR COMPONENT HAVING A CHIP CARRIER WITH OPENINGS FOR MAKING CONTACT

CROSS-REFERENCE TO RELATED APPLICATION

This application is a continuation of copending International Application No. PCT/DE00/00328, filed Feb. 3, 2000, which designated the United States.

BACKGROUND OF THE INVENTION

Field of the Invention

The present invention relates to a semiconductor component that has at least one semiconductor chip and a chip carrier with a first surface upon which the semiconductor chip is mounted. The semiconductor chip is connected electrically to soldering connection points. The soldering connection points form a conductive connection through openings in the chip carrier that extend from the first surface of the chip carrier through the chip carrier and as far as a second surface of the chip carrier. At least the semiconductor chip is surrounded by a housing that, for example, has been produced by pressure encapsulation with a pressing compound, in a globe-top technique or by providing a filling underneath in a flip-chip arrangement. Such semiconductor components are known from the prior art, for example from U.S. Pat. No. 4,700,276.

The present invention can be used, for example, in logic or high-frequency semiconductor components. However, it can readily be applied to other types of semiconductor components as well, such as memory components.

Normally, in the case of such semiconductor components, the semiconductor chips are most often mounted on metal leadframes or laminate substrates as chip carriers. Contact is subsequently made with the chip either using the wire bonding technique or the flip-chip technique. The encapsulation of the chip is generally carried out by pressure encapsulation by means of transfer molding. The contact terminals or contact pads of the component are located on the underside of the semiconductor component. Since these components do not have any conventional pin terminals, one speaks of "leadless components" and of "leadless chip carriers" (LCC). Such components from the prior art, having a leadframe or laminate chip carrier are illustrated in FIGS. 1 and 2. Using "leadless chip components", as compared with conventional components, a considerably higher number of connections can be implemented using the same area on the printed circuit board. In the case of an identical number of connections, a considerably lower area need be utilized and the overall height of the components can be low at the same time. In particular, in the case of high-frequency applications, advantages result from short signal paths and from the compact design of the components. The good attachment of the component to the printed circuit board, and the small component dimensions have a beneficial effect on the mechanical load bearing capacity of the component and also on its fixing to the printed circuit board.

The designs of such semiconductor components that have previously been disclosed by the prior art have considerable disadvantages, however. For example, although the semiconductor components illustrated in FIG. 1 which have a leadframe chip carrier have a high reliability and stability during production and during the operation of the component, great problems arise when covering the semiconductor component with a pressing compound. Since the leadframe has many openings, great problems result, in the case of one-sided pressure encapsulation, when sealing off the chip carrier in the injection molding tool in such a way that penetration of the pressing compound from the side on which the chip is arranged to the opposite side, on which the connections to the printed circuit board are arranged, is prevented. Therefore, either the complicated application of seals, such as sealing foils, to the underside of the chip carrier is necessary, or the chip carrier is initially structured only from one side and, following the pressure encapsulation of the unstructured part on the underside of the chip carrier, the structuring is removed in an etching step. In both cases, therefore, relatively complicated processing of the semiconductor component is necessary in order to ensure optimal pressure encapsulation. This is necessary in particular if the individual semiconductor chips are to be combined in the form of a matrix array. Although one alternative to this is to pressure-encapsulate each individual chip, the result of this is a greater space requirement for each individual chip, and therefore a lower number of semiconductor chips per unit area. The overall capacity of the production plants which can be achieved with this decreases drastically.

The abovementioned problems when pressure encapsulating the semiconductor components can be avoided if, instead of a leadframe chip carrier, a laminate chip carrier is used. The latter has no openings through which the pressing compound could get onto the underside of the semiconductor component. However, laminate chip carriers have great disadvantages with respect to their reliability and stability, in particular on account of their significantly increased sensitivity to moisture and the risk of the occurrence of soldering shock (popcorn effect).

SUMMARY OF THE INVENTION

It is accordingly an object of the invention to provide a semiconductor component having at least one semiconductor chip and a chip carrier which overcomes the above-mentioned disadvantageous of the prior art apparatus of this general type. In particular, it is an object of the invention to provide such a semiconductor component which has a high reliability and which can be constructed using simple production techniques.

With the foregoing and other objects in view there is provided, in accordance with the invention, a semiconductor component that includes a chip carrier having a first surface and a second surface. The chip carrier has openings extending from the first surface to the second surface. At least one semiconductor chip is mounted on the first surface. Soldering connection points enable direct contact thereto and are located near the second surface of the chip carrier. The soldering connection points are formed by at least one metal foil that lines the openings and that extends through the openings from the first surface to the second surface. Contact-making points are electrically connected to the semiconductor chip and form electrically conductive connections which extend through the openings in the chip carrier to the soldering connection points. A housing surrounds at least the semiconductor chip. A further metal foil is located between the semiconductor chip and the chip carrier and forms a soldering connection point. The openings include at least one opening that is located underneath the semiconductor chip. The further metal foil extends through the opening that is located underneath the semiconductor chip to the first surface and to the second surface.

In other words, the chip carrier of the semiconductor component has openings which extend from a first surface of the chip carrier through the chip carrier as far as a second surface. The chip carrier is ideally selected from a material which ensures high reliability and stability. In order at the same time to achieve tightness of the semiconductor component when it is being pressure encapsulated with a pressing compound, the openings in the chip carrier are lined with a metal foil which, at the same time, forms the soldering connection points of the semiconductor component. In this case, the metal foil extends from the first surface of the chip carrier through the openings in the direction of the second surface of the chip carrier. The metal foil therefore covers the entire area of the openings in the chip carrier and therefore seals the openings off effectively against possible penetration of the pressing compound. The metal foil can also simultaneously form the contact-making points which are used to produce a conductive connection to the semiconductor chip. However, separate contact-making points can also be provided, which then have a conductive connection to the metal foil. However, contact can be made directly to the soldering connection points from the second surface of the chip carrier. Underneath the semiconductor chip, there is at least one further opening in the chip carrier. In this case, a further metal foil is arranged between the semiconductor chip and the chip carrier. The further metal foil clads this at least one opening and extends from the first surface of the chip carrier through the opening to the second surface of the chip carrier. This metal foil permits the electrical connection of the semiconductor chip at the rear, so that the semiconductor component is well suited, for example, for individual semiconductors. Furthermore, connecting the underside of the chip to the metal foil results in better heat dissipation or shielding or grounding of the semiconductor chip with respect to the printed circuit board. Depending on the size of the opening in the chip carrier underneath the semiconductor chip, a partial or even whole-area connection between the underside of the chip and the printed circuit board can be carried out by soldering the metal foil onto the printed circuit board.

Here, the metal foil can cover part of the first surface which adjoins the rim of the openings. However, provision can also be made for the metal foil to be located only in the openings and not to extend beyond the rim of the openings onto the surface of the chip carrier. If the metal foil is also used as a contact-making point, then in this case, contact can be made with the metal foil in order to produce a conductive connection to the semiconductor chip in the interior of the opening. If, however, the metal foil extends beyond the rim of the opening as far as the first surface of the chip carrier, then contact can also be made with the metal foil in the area of the first surface of the chip carrier. As a rule, a separate piece of metal foil is provided for each of the openings since the latter are most often intended not to have any electrical connection to one another. However, if appropriate a plurality of openings can also be lined by a continuous metal film, where such an electrical connection is indeed desirable.

In the area of the second surface of the chip carrier, provision can be made for the metal film to terminate flush with the second surface or for the metal film to project out of the opening over the second surface. In the last case, the metal foil forms a contact which projects beyond the chip carrier and can be used for the purpose of ensuring a certain spacing between the chip carrier and the printed circuit board. However, provision can also be made for the metal foil in the opening not to extend quite as far as the rim of the opening and therefore not quite as far as the second surface of the chip carrier. The conductive connection to the printed circuit board to be fitted underneath can be produced by appropriate soldered connections with solder material being provided on the printed circuit board and filling the remaining area of the openings with solder material during soldering.

As already mentioned, the chip carrier should consist of the most stable and reliable material. In principle, for example, ceramic or metal can be used. However, the chip carrier preferably consists of a plastic tape, for example of epoxy glass, polyimide or polyester.

For the metal film, correspondingly suitable metals are used, such as copper, copper alloys or iron-nickel alloys.

The metal foil can be introduced into the openings in the chip carrier, for example, by a structured metal layer being laminated onto the chip carrier first, and then being drawn into the openings in the chip carrier by a deep drawing process or an embossing process. Provision can also be made for the metal foil already to be completely structured before being laminated on, so that after being laminated on, the metal foil already lines the openings in the desired manner, and therefore a further embossing or deep-drawing process becomes dispensable. In this way, by means of the shaped metal foil on the underside of the chip carrier, a defined soldering connection point for the solder connection is produced. In the area of the upper side of the chip carrier, the metal foil can be used as a defined contact-making point for the electrical connection of the semiconductor chip to the chip carrier.

Other features which are considered as characteristic for the invention are set forth in the appended claims.

Although the invention is illustrated and described herein as embodied in a semiconductor component having a chip carrier with openings for making contact, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

FIG. 3a shows a semiconductor component with a chip carrier having openings that will be subsequently lined by a metal foil;

FIG. 3b shows the semiconductor component of FIG. 3a in which the open have been lined by the metal foil;

FIG. 5 shows examples of the arrangement of the openings or soldering connection points;

Figure 7A:
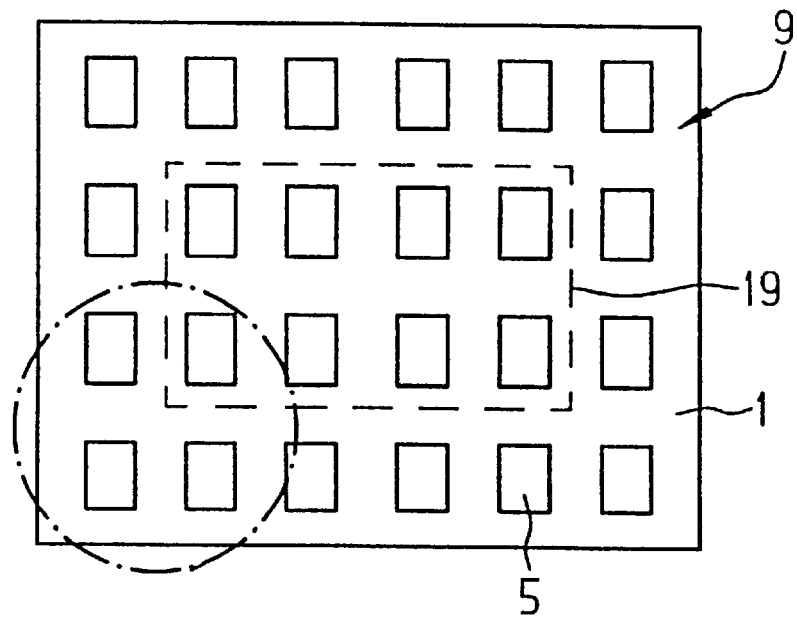
FIG. 7a shows a plan view of a chip carrier having a matrix arrangement of soldering connection points and conductor paths to leading to the openings.
Figure 7B:
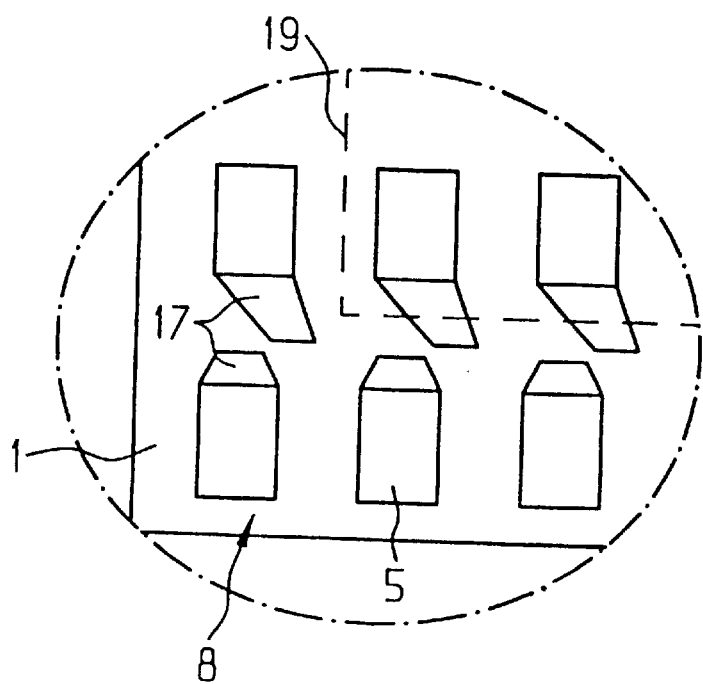
Figure 10:
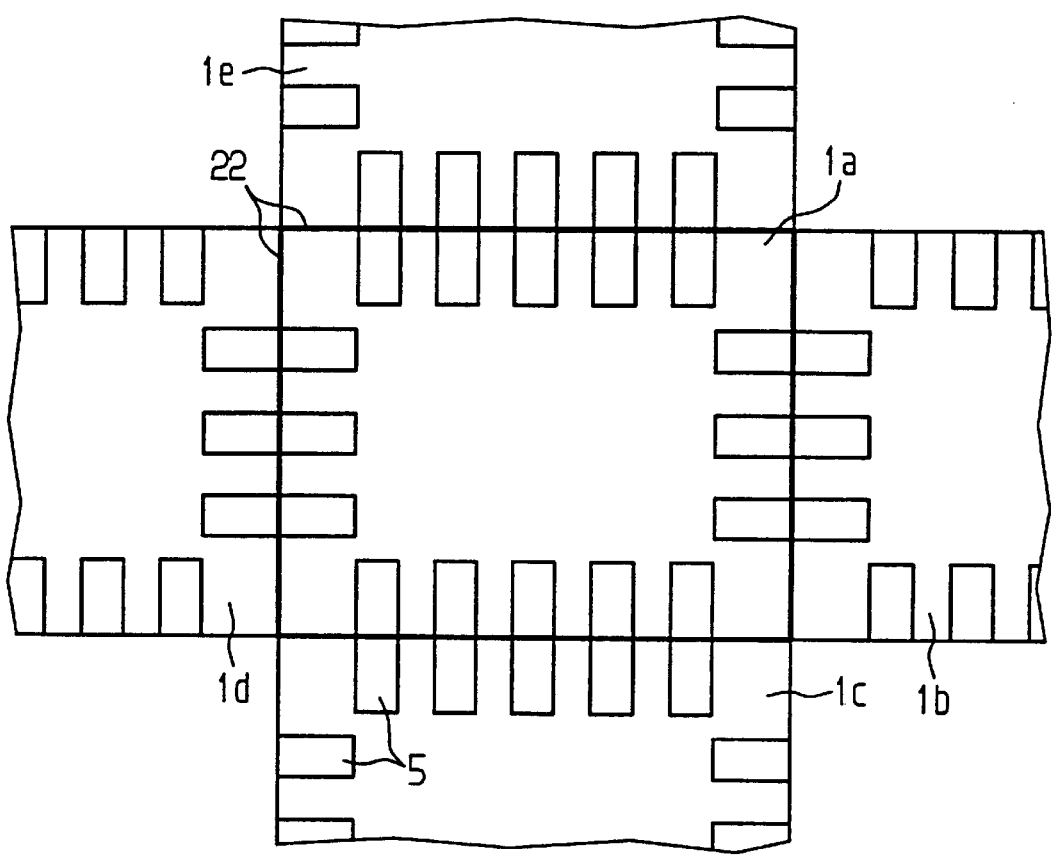
Figure 11:
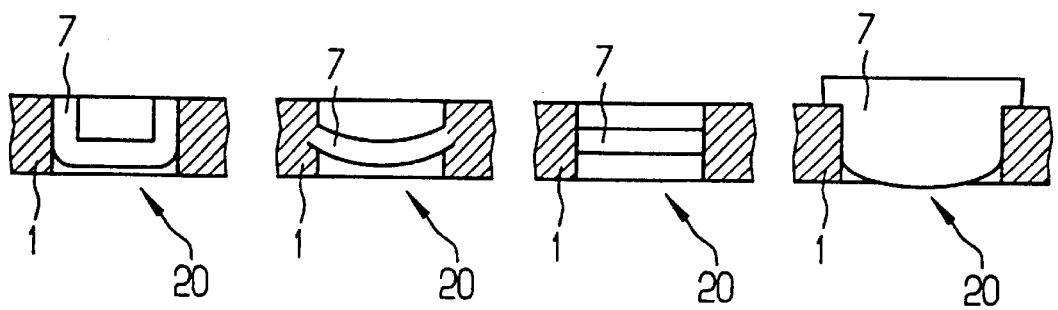

FIG. 7b an enlarged portion of the view of the chip carrier shown in FIG. 7b;

FIG. 8 a plan view of a chip carrier with a multi-chip arrangement;

FIG. 9 shows the configuration of FIG. 3b, but as a ball grid array and with wedge contacting of the metal foil;

FIG. 10 shows a plan view of a matrix array having a plurality of chip carriers with soldering connection points at the edge of the chip carrier; and FIG. 11 shows schematic cross section through an opening in the chip carrier that is lined with a metal foil.

DESCRIPTION OF THE PREFERRED EMBODIMENTS

Referring now to the figures of the drawing in detail and first, particularly, to FIG. 3a thereof, there is shown, a semiconductor component including a plastic tape 1 that is provided as a chip carrier. A semiconductor chip 2 is mounted on the plastic tape 1. The semiconductor chip 2 and the chip carrier 1 are connected to each other by an adhesive layer 12. The chip carrier has openings 20 which extend from the first surface 8 of the chip carrier 1 as far as the second surface 9 of the chip carrier 1. The subsequent position of a metal foil 7, which is intended to line the openings 20, is indicated by the dotted areas.

FIG. 3b shows that these openings 20 are lined with a metal foil 7, which extends beyond the rim of the openings 20 as far as the first surface 8. On the other side of the chip carrier 1, the metal foil 7 extends as far as the second surface 9 of the chip carrier. The metal foil 7 fills the opening 20 in the chip carrier completely and therefore seals it off.

In order to produce a conductive connection between the semiconductor chip 2 and the metal foil 7, which at the same time forms a soldering connection point 5 and a contact-making point 6, bonding wires 3 are provided. In order to make contact, in this case conventional technologies such as nailhead and/or wedge contacting means can be provided. If in this case contact is made with the metal foil 7 in the interior of the opening 20, as shown in FIG. 3b, then an elevation 16 is preferably formed on the metal foil 7 in the interior of the opening 20, for example a gold bump, as it is known, which makes it easier to make contact. Contact can then be made on this elevation 16 by using the conventional methods. Thus, for example, in the case of FIG. 3b, the making of contact on the sides of the metal foil 7 is done using wedge contacting on the previously introduced elevation 16.

As FIG. 7b shows schematically, for short conductor paths 17 can be led away from the metal foil 7 which lines the openings 20. Contact is then made on the conductor tracks 17 instead of directly on the metal foil 7. By means of this measure, the requirements regarding making contact with the bonding wires 3 that connect to the semiconductor chip 2 can be decoupled from the requirements regarding the metal foil 7. These requirements can, therefore, be optimized separately from one another. In addition, this measure enables, for example, a larger number of contact connections 6 for bonding wires 3 and soldering connection points 5 to the printed circuit board to be accommodated on the chip carrier 1, and enables more degrees of freedom in arranging the soldering connection points 5 on the chip carrier 1. In FIG. 7b, the openings 20 or the soldering connection points 5 are applied to the chip carrier 1 in a matrix form. FIG. 7a shows a plan view of the underside 9 of the chip carrier 1 in which the position of the semiconductor chip 2 on the opposite side 8 of the chip carrier is indicated by the dashed line 19. Some of the openings 20, in which the soldering connection points 5 toward the printed circuit board are formed, would therefore be covered by the semiconductor chip 2 on the opposite side. In order nevertheless to permit contact to be made, as illustrated in FIG. 7b, the conductor paths 17 are arranged on the upper side 8 of the chip carrier 1 and are connected to the metal foils 7 in the openings 20 in such a way that the conductor paths 17 project underneath the semiconductor chip 2 and contact can therefore be made with them. These conductor paths 7 can likewise be produced from the metal foil 7 which is used to line the openings 20, or they can be produced in a conventional way, for example by means of a second metal foil.

For the purpose of encapsulation, the semiconductor component is encapsulated under pressure on one side with a pressing compound 4, which forms the housing of the semiconductor component. The housing 4 in FIG. 3b has vertical side flanks, since in this case the component is pressure encapsulated in a matrix array and is subsequently released from the composite, for example, by sawing up the matrix array.

Figure 1:
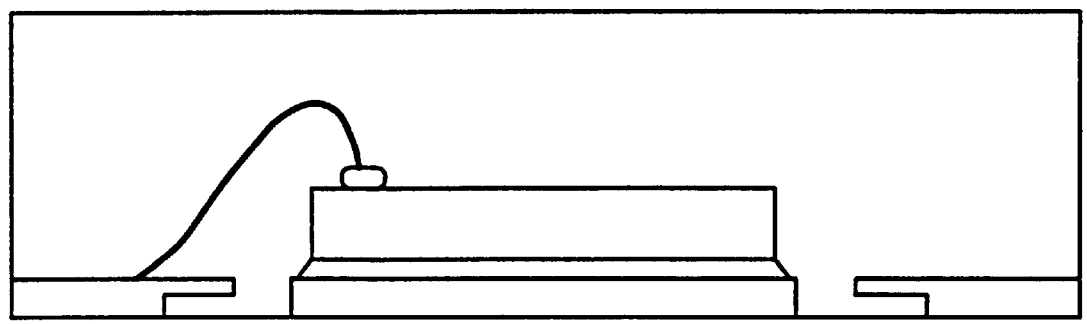
FIG. 1 shows a prior art semiconductor component with a leadframe chip carrier.
Figure 2:
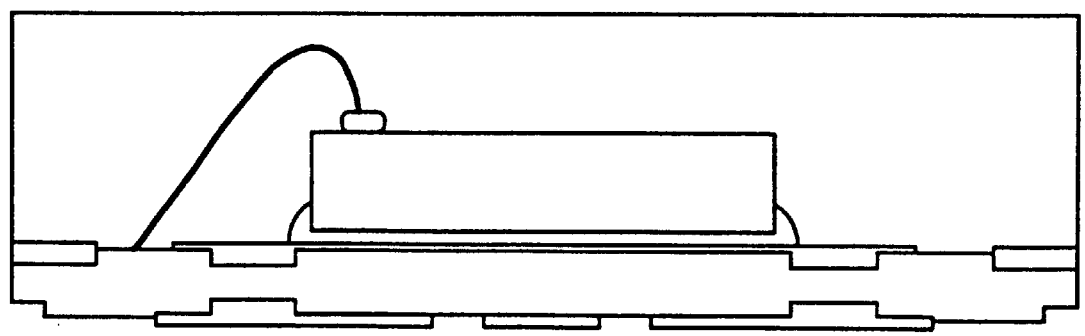
FIG. 2 shows a prior art semiconductor component with a laminate chip carrier.
Figure 4:
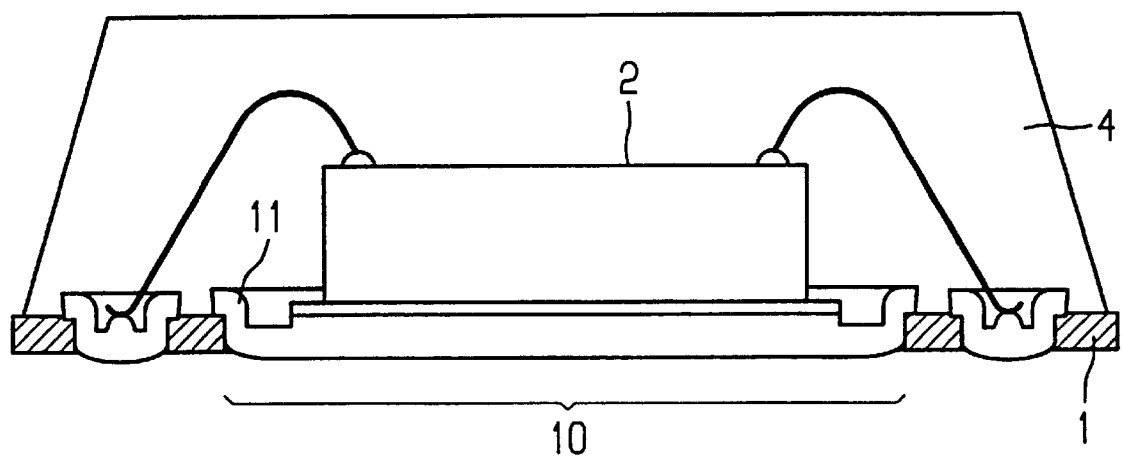
FIG. 4 shows he semiconductor component of FIG. 3b that has an additional opening in the chip carrier underneath the semiconductor chip and a metal foil which is located between the semiconductor chip and a chip carrier or a printed circuit board.

FIG. 4 shows an alternative embodiment of the semiconductor component of FIG. 3b. In this case, a further opening 10 is provided in the chip carrier 1 underneath the semiconductor chip 2. In the example of FIG. 4, this opening 10 has a greater extent than the semiconductor chip 2. However, provision can also be made for one or more openings of lesser extent than the semiconductor chip 2 to be provided underneath the semiconductor chip 2. This is shown by way of example in the plan view of FIG. 5 of a chip carrier. The opening 10 permits electrical contact to a connection that is located on the underside of the semiconductor chip, as is primarily common in the case of single semiconductors, for example diodes, transistors, MOSFETS and so on.

In the example of FIG. 4, the metal foil in the opening 10 ensures the dissipation of heat from the entire area of the underside of the semiconductor chip 2 toward the printed circuit board. FIG. 5a shows a plan view of the opening 10, which is greater than the extent of the semiconductor chip 2. However, where the dissipation of heat over the whole area in this way is not necessary, only partial dissipation of heat can be provided by a number of small openings 10, as shown in FIG. 5b. These several openings 10 are arranged on the chip carrier 1 such that, after the semiconductor chip 2 has been mounted, all of the openings 10 will be covered by the semiconductor chip 2. Here, all of the openings 10 can be lined by a continuous metal foil 11. Alternatively, in each case, a separate piece of metal foil 11 can be provided for each of the openings 10. For a low electrical resistance, the greatest possible coverage of the semiconductor chip and the metal foil is desirable.

Furthermore, FIG. 4 illustrates an alternative form of the housing 4, which has chamfered side flanks. Here, individual pressure encapsulation of the component by means of individual cavities has been performed and subsequently, in order to separate the components, the chip carrier 1 has been divided up, for example by sawing, stamping, milling, laser, water jet or similar means.

Figure 6:
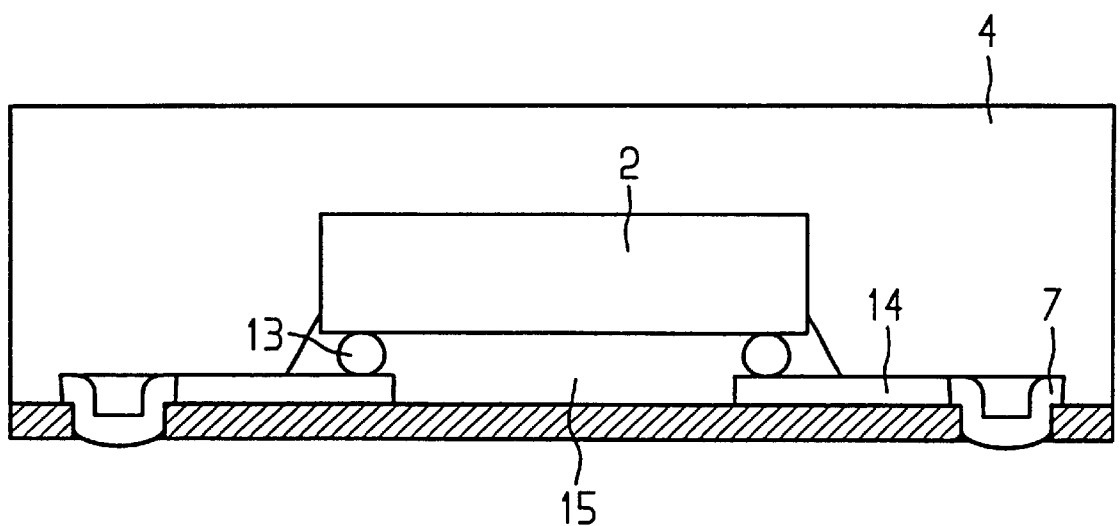
FIG. 6 shows the semiconductor component of FIG. 3b, but with flip-chip mounting technology.

FIG. 6 shows a semiconductor component according to FIG. 3b, but no bonding wires have been provided to produce a conductive connection between the semiconductor chip 2 and the contact-making points 6. Instead the semiconductor chip 2 is mounted using the flip-chip technique, in which the conductive connection is produced from the underside of the semiconductor chip 2. Contact spheres 13 are provided at the underside of the semiconductor chip 2 and are embedded in an underfill 15. Starting from these contact spheres 13, conductor trains 14 are drawn to the metal foils 7. These conductor trains 14 can be produced from the metal foil 7 that is used to line the openings 20, or they can be produced, for example, by a second metal foil.

FIG. 8 shows an alternate embodiment of the invention in the form of a multi-chip component, in which a plurality of semiconductor chips 2a, 2b are mounted on a common chip carrier. In this case, bonding wires 3a are provided, which connect the semiconductor chips 2a, 2b to one another. Further bonding wires 3b are also provided to make contact with the metal foils 7 in the openings 20.

FIG. 9 illustrates a further alternate embodiment of the invention in which solder balls 18 are applied to the metal foils 7 on the underside of the chip carrier 1 so that a ball grid array arrangement (BGA) is produced. The advantage in this case is that simplified printed circuit boards can be used and no longer have to have any soldered contacts. FIG. 9 also simultaneously shows a preferred form of making contact between the bond wires 3 and the metal foil 7, namely in the form of wedge that contacts the area of the metal foil that extends beyond the rim of the opening 20 onto the upper surface 8.

For all the aforementioned embodiments, the metal foil 7 can be constructed to terminate flush with the second surface 9 or to project out of the opening 20 over the second surface 9. However, the metal foil 7 in the opening 20 can be constructed to extend not quite as far as the rim of the opening 20 and therefore not quite as far as the second surface 9 of the chip carrier 1.

FIGS. 11a-11D each show, in schematic form, a cross section through an alternately constructed opening 20. FIGS. 11a-11D clearly show some examples of how the metal foil 7 can be arranged in the opening 20 in different ways. For example, as shown in FIG. 11a, the metal foil 7 can extend along the side walls of the opening 20, and in the area of the lower surface 9 of the chip carrier 1, can form a largely horizontal or a slightly curved termination. FIG. 11b shows a metal foil 7 which is wedged in the opening 20 with a slight curvature. In FIG. 11c, the extent of the metal foil 7 corresponds exactly to the size of the opening 20. FIG. 11d shows a metal foil 7 that, before being laminated onto the chip carrier 1, has already been structured in such a way that it will line the opening 20 precisely, and therefore the metal foil 7 is merely inserted into the opening 20 as a type of stopper within the context of the lamination process.

FIG. 10 shows a particularly advantageous arrangement of the openings 20 and therefore of the soldering connection points 5. The not yet separated chip carriers 1a to 1e are in this case arranged in a matrix array. The lines 22 represent the future edges of the chip carriers 1a to 1e. When the chip carriers are separated, the matrix array can be divided up along the lines 22, as already described above, by stamping, sawing up, etc. The openings 20 and therefore the soldering connection points 5 are in each case arranged at the edges of the chip carriers 1a to 1e in such a way that in each case, one soldering connection point of a chip carrier, for example chip carrier 1a, is opposite a soldering connection point of an adjacent chip carrier, for example chip carrier 1b, and adjoins the connection point of chip carrier 1b directly. The openings 20 for these two soldering connection points can therefore be produced in a single process as a single opening approximately twice as long, which extends beyond the edge of the chip carriers 1a, 1b. Likewise, these two openings 20, which therefore initially still form a single opening, can be lined by the metal foil 7 in a common step in order to form the soldering connection points 5. It is therefore possible, by means of the specific arrangement according to FIG. 10, for example, for a single stamping and embossing process to be used to produce two soldering connection points 5 which are initially still connected, but are separated after the separation, by which means the production of the components is simplified and accelerated considerably.

We claim:

1. A semiconductor component, comprising:
   a chip carrier having a first surface and a second surface and having openings extending from said first surface to said second surface;
   at least one semiconductor chip mounted on said first surface;
   soldering connection points located near said second surface of said chip carrier, said soldering connection points are formed by at least one metal foil that lines said openings and that extends through said openings from said first surface to said second surface;
   contact-making points that are electrically connected to said semiconductor chip and that form electrically conductive connections which extend through openings in said chip carrier to said soldering connection points;
   a housing that surrounds at least said semiconductor chip;
   an elevation enabling electrical contact to be made with said at least one metal foil; and
   a further metal foil that is located between said semiconductor chip and said chip carrier and that forms a soldering connection point; said openings including at least one opening that is located underneath said semiconductor chip;
   said further metal foil extending through said opening that is located underneath said semiconductor chip to said first surface and to said second surface;
   each one of said openings having an interior;
   said elevation formed on said at least one metal foil in said interior of one of said openings; and
   said chip carrier having an edge and said openings located at said edge of said chip carrier.

2. The semiconductor component according to claim 1, wherein:
   said first surface has a part that adjoins said openings; and
   said at least one metal foil covers said part of said first surface that adjoins said openings.

3. The semiconductor component according to claim 1, wherein said at least one metal foil terminates flush with said second surface.

4. The semiconductor component according to claim 1, wherein said at least one metal foil projects out of said openings and over said second surface.

5. The semiconductor component according to claim 1, wherein:
   said openings have rims near said second surface; and
   said at least one metal foil does not extend as far as said rims.

6. The semiconductor component according to claim 1, comprising conductor paths for enabling contact with said at least one metal foil, said conductor paths located on said first surface and connected to said at least one metal foil.

7. The semiconductor component according to claim 1, wherein said chip carrier is made of a plastic tape.

8. The semiconductor component according to claim 7, wherein said plastic tape is a material selected from the group consisting of epoxy glass, polyimide, and polyester.

9. The semiconductor component according to claim 1, wherein said metal foil is made of a material selected from the group consisting of copper, a copper alloy, and an iron-nickel alloy.

10. The semiconductor component according to claim 1, wherein said semiconductor chip is mounted on said chip carrier using a flip-chip mounting technique.

11. The semiconductor component according to claim 1, wherein:

said semiconductor chip has a side; and said housing is made of a pressing compound that has been pressed around said side of said semiconductor chip using a process selected from the group consisting of an individual pressure encapsulation and a matrix array pressure encapsulation.

* * * * *